(12) United States Patent
Kataoka et al.

(10) Patent No.: US 11,769,810 B2
(45) Date of Patent: Sep. 26, 2023

(54) SEMICONDUCTOR DEVICE AND SEMICONDUCTOR MEMORY DEVICE

(71) Applicant: Kioxia Corporation, Tokyo (JP)

(72) Inventors: Junji Kataoka, Kawasaki Kanagawa (JP); Tomomasa Ueda, Yokohama Kanagawa (JP); Shushu Zheng, Kawasaki Kanagawa (JP); Nobuyoshi Saito, Tokyo (JP); Keiji Ikeda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 163 days.

(21) Appl. No.: 17/198,673

(22) Filed: Mar. 11, 2021

(65) Prior Publication Data

US 2022/0085182 A1 Mar. 17, 2022

(30) Foreign Application Priority Data

Sep. 16, 2020 (JP) ................. 2020-155888

(51) Int. Cl.
*H01L 29/423* (2006.01)
*H01L 29/786* (2006.01)
*H01L 29/22* (2006.01)
*H10B 12/00* (2023.01)

(52) U.S. Cl.
CPC ........ *H01L 29/42356* (2013.01); *H01L 29/22* (2013.01); *H01L 29/42372* (2013.01); *H01L 29/7869* (2013.01); *H10B 12/30* (2023.02)

(58) Field of Classification Search
CPC ............... H01L 27/10805; H01L 29/22; H01L 29/7869; H01L 29/42392; H01L 29/78642; H01L 29/42356; H01L 29/42372

See application file for complete search history.

(56) References Cited

U.S. PATENT DOCUMENTS

| 8,378,341 B2 | 2/2013 | Hayashi |
| 9,698,272 B1 | 7/2017 | Ikeda |
| 10,192,876 B2 | 1/2019 | Miura |

(Continued)

FOREIGN PATENT DOCUMENTS

| JP | 2008-270313 A | 11/2008 |
| JP | 2015084411 | * 4/2015 |

(Continued)

*Primary Examiner* — Wasiul Haider
(74) *Attorney, Agent, or Firm* — Foley & Lardner LLP

(57) ABSTRACT

A semiconductor device according to an embodiment includes an oxide semiconductor layer, a gate electrode, and the gate electrode, a first electrode electrically connected to the oxide semiconductor layer, a second electrode electrically connected to the oxide semiconductor layer, a first conductive layer provided at at least one position between the oxide semiconductor layer and the first electrode and between the oxide semiconductor layer and the second electrode, the first conductive layer containing a first metal element, a first element different from the first metal element, and one of oxygen (O) or nitrogen (N), and a second conductive layer between the oxide semiconductor layer and the first conductive layer, the second conductive layer containing oxygen (O) and a second element different from both of the first metal element and the first element. The gate electrode is between the first electrode and the second electrode in the first direction.

16 Claims, 10 Drawing Sheets

(56) References Cited

U.S. PATENT DOCUMENTS

| | | | |
|---|---|---|---|
| 2008/0210942 A1* | 9/2008 | Yang | H01L 29/66765 |
| | | | 257/E31.124 |
| 2014/0264323 A1 | 9/2014 | Sasagawa et al. | |
| 2020/0111920 A1* | 4/2020 | Sills | H10B 63/34 |

FOREIGN PATENT DOCUMENTS

| | | |
|---|---|---|
| JP | 5856227 B2 | 2/2016 |
| JP | 2017-168623 A | 9/2017 |
| JP | 2018-157101 A | 10/2018 |

* cited by examiner

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2020-155888, filed on Sep. 16, 2020, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has an excellent characteristic that a channel leakage current during off-operation is extremely small. Therefore, for example, application of the oxide semiconductor transistor to a switching transistor of a memory cell of a dynamic random access memory (DRAM) is examined.

For example, when the oxide semiconductor transistor is applied to the switching transistor of the memory cell, the oxide semiconductor transistor undergoes a heat treatment associated with the formation of the memory cell or wiring. Therefore, it is expected to realize an oxide semiconductor transistor having high heat resistance, which has little fluctuation in characteristics even after the heat treatment.

DETAILED DESCRIPTION

Figure 1:
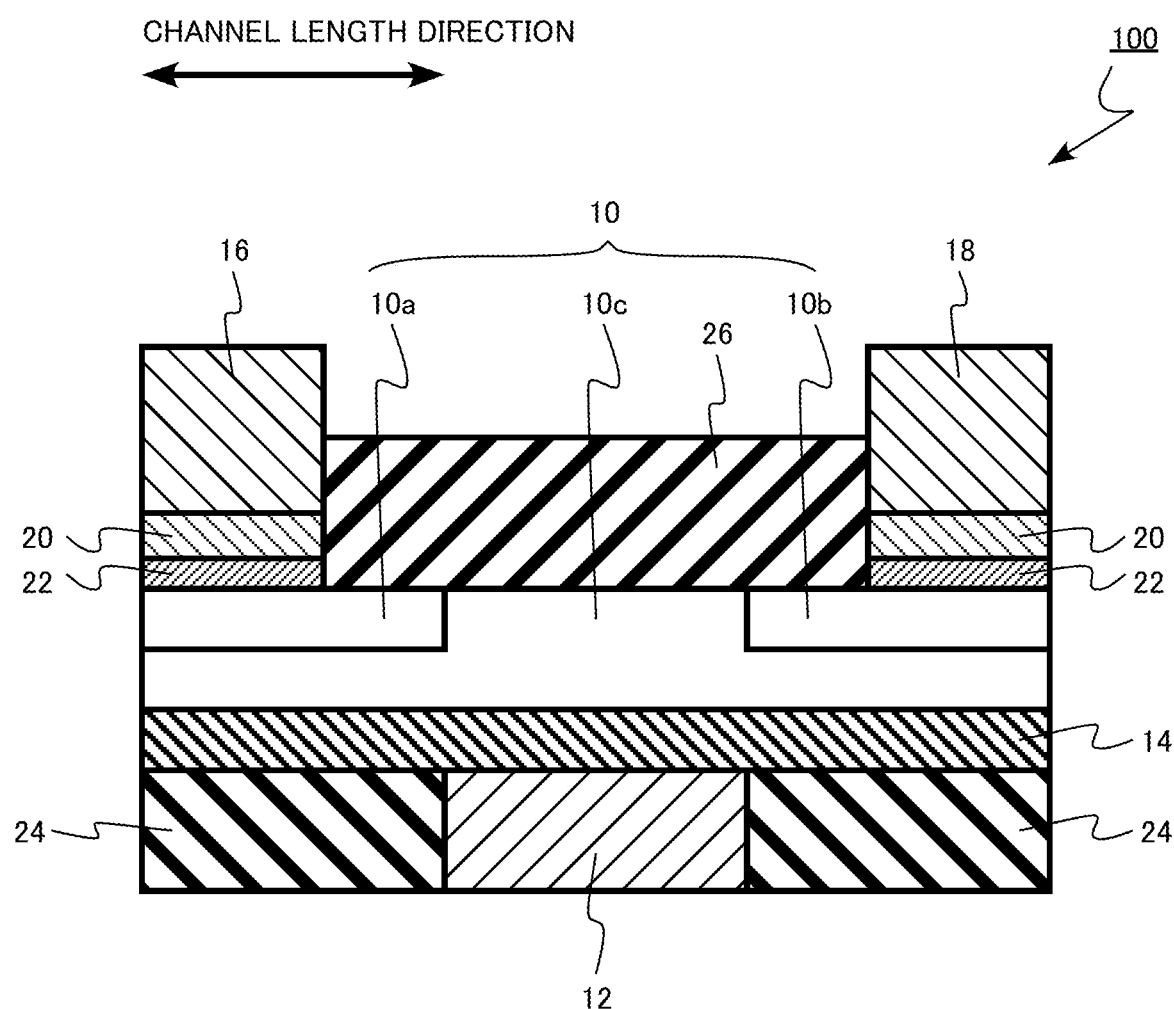
FIG. 1 is a schematic cross-sectional view of a semiconductor device according to a first embodiment.

A semiconductor device according to an embodiment includes: an oxide semiconductor layer; a gate electrode; a gate insulating layer provided between the oxide semiconductor layer and the gate electrode; a first electrode electrically connected to the oxide semiconductor layer at a first position of the oxide semiconductor layer; a second electrode electrically connected to the oxide semiconductor layer at a second position of the oxide semiconductor layer disposed in a first direction with respect to the first position; a first conductive layer provided at at least one position between the oxide semiconductor layer and the first electrode or between the oxide semiconductor layer and the second electrode, the first conductive layer containing a first metal element, a first element different from the first metal element, and at least one element of oxygen (O) or nitrogen (N); and a second conductive layer provided between the oxide semiconductor layer and the first conductive layer, the second conductive layer containing oxygen (O) and a second element different from the first metal element and the first element. A third position of the oxide semiconductor layer facing the gate electrode is disposed between the first position and the second position in the first direction.

Hereinafter, embodiments of the present disclosure will be described with reference to the drawings. In the following description, the same or similar members are denoted by the same reference numerals and the description of the members described once is appropriately omitted.

Further, in the present specification, a term "above" or "below" may be used for convenience. "Above" or "below" is a term that indicates a relative positional relation in the drawings, but does not define a positional relation with respect to gravity.

The qualitative analysis and the quantitative analysis of chemical compositions of members forming a semiconductor device and a semiconductor memory device in the present specification can be carried out by secondary ion mass spectrometry (SIMS), energy dispersive X-ray spectroscopy (EDX), and Rutherford back-scattering spectroscopy (RBS), for example. In addition, for measurement of the thickness of the members forming the semiconductor device, a distance between the members, a crystal grain size, and the like, for example, a transmission electron microscope (TEM) can be used.

First Embodiment

A semiconductor device according to a first embodiment includes: an oxide semiconductor layer; a gate electrode; a gate insulating layer provided between the oxide semiconductor layer and the gate electrode; a first electrode electrically connected to the oxide semiconductor layer at a first position of the oxide semiconductor layer; a second electrode electrically connected to the oxide semiconductor layer at a second position of the oxide semiconductor layer disposed in a first direction with respect to the first position; a first conductive layer provided at at least one position between the oxide semiconductor layer and the first electrode or between the oxide semiconductor layer and the second electrode, the first conductive layer containing a first metal element, a first element different from the first metal element, and at least one element of oxygen (O) or nitrogen (N); and a second conductive layer provided between the oxide semiconductor layer and the first conductive layer, the second conductive layer containing a second element different from the first metal element and the first element, and oxygen (O). A third position of the oxide semiconductor layer facing the gate electrode is disposed between the first position and the second position in the first direction.

FIG. 1 is a schematic cross-sectional view of the semiconductor device according to the first embodiment.

The semiconductor device according to the first embodiment is a transistor 100. The transistor 100 is an oxide semiconductor transistor in which a channel is formed in an oxide semiconductor layer. The transistor 100 is a so-called bottom gate type transistor in which a gate electrode is provided below the oxide semiconductor layer provided with the channel, and a source electrode and a drain electrode are provided above the oxide semiconductor layer.

The transistor 100 includes an oxide semiconductor layer 10, a gate electrode 12, a gate insulating layer 14, a source electrode 16, a drain electrode 18, a barrier layer 20, a contact layer 22, a first insulating layer 24, and a second insulating layer 26.

The source electrode 16 is an example of a first electrode. The drain electrode 18 is an example of a second electrode. The barrier layer 20 is an example of a first conductive layer. The contact layer 22 is an example of a second conductive layer.

The oxide semiconductor layer 10 has a first region 10a, a second region 10b, and a third region 10c.

The oxide semiconductor layer 10 is provided with a channel functioning as a current path when the transistor 100 is turned on. A direction in which electrons flow in the channel is called a channel length direction. The channel length direction is indicated by two-way arrows in FIG. 1.

The oxide semiconductor layer 10 is an oxide semiconductor. The oxide semiconductor layer 10 is a metal oxide. The oxide semiconductor layer 10 is, for example, amorphous.

The oxide semiconductor layer 10 contains, for example, indium (In), gallium (Ga), and zinc (Zn). A total atomic ratio of indium, gallium, and zinc among the metal elements contained in the oxide semiconductor layer 10 is, for example, equal to or more than 90%. Further, the total atomic ratio of indium, gallium, and zinc among the elements other than oxygen contained in the oxide semiconductor layer 10 is, for example, equal to or more than 90%. For example, in the oxide semiconductor layer 10, there is no element other than oxygen having an atomic ratio larger than that of any one of indium, gallium, and zinc.

The oxide semiconductor layer 10 has a first region 10a, a second region 10b, and a third region 10c. At least a part of the third region 10c is provided between the first region 10a and the second region 10b.

The first region 10a functions as a source region of the transistor 100, and the second region 10b functions as a drain region of the transistor 100. Further, a channel is formed in the third region 10c when the transistor 100 is turned on.

The first region 10a and the second region 10b are, for example, n-type semiconductors. An oxygen deficiency concentration in the first region 10a and an oxygen deficiency concentration in the second region 10b are higher than, for example, an oxygen deficiency concentration in the third region 10c. The oxygen deficiency in the oxide semiconductor layer 10 functions as a donor.

An n-type carrier concentration in the first region 10a and an n-type carrier concentration in the second region 10b are higher than, for example, an n-type carrier concentration in the third region 10c. An electric resistance of the first region 10a and an electric resistance of the second region 10b are lower than, for example, an electric resistance of the third region 10c.

A thickness of the oxide semiconductor layer 10 is, for example, equal to or more than 10 nm and equal to or less than 100 nm.

The oxide semiconductor layer 10 is formed by, for example, an atomic layer deposition method (ALD method).

The gate electrode 12 is provided below the oxide semiconductor layer 10. The gate electrode 12 is, for example, a metal, a metal compound, or a semiconductor. The gate electrode 12 is, for example, tungsten (W). A gate length of the gate electrode 12 is, for example, equal to or more than 20 nm and equal to or less than 100 nm.

The gate insulating layer 14 is provided between the oxide semiconductor layer 10 and the gate electrode 12. The gate insulating layer 14 is provided between the third region 10c and the gate electrode 12.

The gate insulating layer 14 is, for example, an oxide or an oxynitride. The gate insulating layer 14 is, for example, silicon oxide or aluminum oxide. A thickness of the gate insulating layer 14 is, for example, equal to or more than 2 nm and equal to or less than 10 nm.

Note that an oxide layer (not shown) of a material different from that of the gate insulating layer 14 can be provided between the oxide semiconductor layer 10 and the gate insulating layer 14.

The source electrode 16 is electrically connected to the oxide semiconductor layer 10 at a first position of the oxide semiconductor layer 10. The first position is, for example, a position where the contact layer 22 between the source electrode 16 and the oxide semiconductor layer 10 is in contact with the oxide semiconductor layer 10.

The source electrode 16 is provided above the oxide semiconductor layer 10. The oxide semiconductor layer 10 is interposed between the gate electrode 12 and the source electrode 16.

The source electrode 16 is provided above the first region 10a. The source electrode 16 is electrically connected to, for example, the first region 10a.

The source electrode 16 is, for example, a metal or a metal compound. The source electrode 16 is, for example, a metal having a chemical composition different from that of the barrier layer 20. The source electrode 16 contains, for example, tungsten (W) or molybdenum (Mo).

A concentration of a first metal element contained in the source electrode 16 is, for example, equal to or less than 1 atomic %. The first metal element is a metal element contained in the barrier layer 20.

The drain electrode 18 is electrically connected to the oxide semiconductor layer 10 at a second position of the oxide semiconductor layer 10. The second position is, for example, a position where the contact layer 22 between the drain electrode 18 and the oxide semiconductor layer 10 is in contact with the oxide semiconductor layer 10.

The second position is disposed in the channel length direction with respect to the first position. The channel length direction is an example of a first direction.

A third position of the oxide semiconductor layer 10 facing the gate electrode 12 is disposed between the first position and the second position in the channel length direction. In other words, when coordinate axes extending in the channel length direction are considered, a coordinate value of the third position is a value between a coordinate value of the first position and a coordinate value of the second position. A position of the channel length direction of a portion of the oxide semiconductor layer 10 facing the gate electrode 12 with the gate insulating layer 14 therebetween is a position between the first position and the second position. In other words, when coordinate axes extending in the channel length direction are considered, a coordinate value of the position of the channel length direction of the portion of the oxide semiconductor layer 10 facing the gate electrode 12 with the gate insulating layer 14 therebetween is a value between a coordinate value of the first position and a coordinate value of the second position.

The drain electrode 18 is provided above the oxide semiconductor layer 10. The oxide semiconductor layer 10 is interposed between the gate electrode 12 and the drain electrode 18.

The drain electrode 18 is provided above the second region 10*b*. The drain electrode 18 is electrically connected to the second region 10*b*.

The drain electrode 18 is, for example, a metal or a metal compound. The drain electrode 18 is, for example, a metal having a chemical composition different from that of the barrier layer 20. The drain electrode 18 contains, for example, tungsten (W) or molybdenum (Mo).

A concentration of the first metal element contained in the drain electrode 18 is, for example, equal to or less than 1 atomic %. The first metal element is a metal element contained in the barrier layer 20.

The barrier layer 20 is provided between the oxide semiconductor layer 10 and the source electrode 16. The barrier layer 20 is provided between the first region 10*a* and the source electrode 16. The barrier layer 20 is in contact with, for example, the source electrode 16. The barrier layer 20 functions as a diffusion barrier for oxygen diffusing from the oxide semiconductor layer 10 to the side of the source electrode 16.

The barrier layer 20 is provided between the oxide semiconductor layer 10 and the drain electrode 18. The barrier layer 20 is provided between the second region 10*b* and the drain electrode 18. The barrier layer 20 is in contact with, for example, the drain electrode 18. The barrier layer 20 functions as a diffusion barrier for oxygen diffusing from the oxide semiconductor layer 10 to the side of the drain electrode 18.

The barrier layer 20 contains a first metal element, a first element different from the first metal element, and at least one element of oxygen (O) or nitrogen (N). As the first element, two or more kinds of first elements may be contained.

The first metal element is at least one element selected from the group consisting of, for example, titanium (Ti), silver (Ag), nickel (Ni), copper (Cu), and tantalum (Ta). Further, the first element is at least one element selected from the group consisting of, for example, zinc (Zn), silicon (Si), aluminum (Al), tin (Sn), gallium (Ga), hafnium (Hf), lantern (La), and cerium (Ce).

The barrier layer 20 is, for example, an oxide, a nitride, or an oxynitride.

The barrier layer 20 is, for example, an oxide containing titanium (Ti) as the first metal element and zinc (Zn) and silicon (Si) as the first element.

A concentration of the first metal element contained in the barrier layer 20 is, for example, equal to or more than 3 atomic % and equal to or less than 30 atomic %.

The thickness of the barrier layer 20 is more than the thickness of the contact layer 22, for example. Each of the thickness of the barrier layer 20 and the thickness of the contact layer 22 is the thickness in a direction from the oxide semiconductor layer 10 toward the source electrode 16.

The thickness of the barrier layer 20 is, for example, 1.5 times or more the thickness of the contact layer 22. The thickness of the barrier layer 20 is, for example, equal to or more than 5 nm and equal to or less than 30 nm.

The barrier layer 20 is, for example, crystalline. The crystal grain size of the barrier layer 20 is smaller than, for example, the crystal grain size of the contact layer 22. The crystal grain size of each of the barrier layer 20 and the contact layer 22 is represented by, for example, a median value of a major axis of crystal grains.

The barrier layer 20 is, for example, amorphous.

The contact layer 22 is provided between the oxide semiconductor layer 10 and the barrier layer 20. The contact layer 22 is provided between the first region 10*a* and the source electrode 16. Further, the contact layer 22 is provided between the second region 10*b* and the drain electrode 18.

The contact layer 22 is in contact with, for example, the barrier layer 20. The contact layer 22 is in contact with, for example, the oxide semiconductor layer 10. The contact layer 22 is in contact with, for example, the first region 10*a*. The contact layer 22 is in contact with, for example, the second region 10*b*.

The contact layer 22 has a function of reducing the resistance between the first region 10*a* and the source electrode 16. The contact layer 22 has a function of reducing the resistance between the second region 10*b* and the drain electrode 18.

The contact layer 22 contains a second element different from both of the first metal element and the first element. As the second element, two or more kinds of second elements may be contained. The contact layer 22 contains oxygen (O).

The second element is at least one element selected from the group consisting of, for example, indium (In), zinc (Zn), tin (Sn), and cadmium (Cd).

The contact layer 22 is, for example, a metal oxide.

The contact layer 22 contains, for example, indium (In) and tin (Sn) as the second element. The contact layer 22 is, for example, an oxide containing indium (In) and tin (Sn).

The thickness of the contact layer 22 is, for example, equal to or more than 1 nm and equal to or less than 10 nm.

The contact layer 22 is, for example, crystalline.

The first insulating layer 24 is provided below the oxide semiconductor layer 10. The first insulating layer 24 is, for example, an oxide, a nitride, or an oxynitride. The first insulating layer 24 is, for example, silicon oxide, silicon nitride, or silicon oxynitride.

The second insulating layer 26 is provided above the oxide semiconductor layer 10. The second insulating layer 26 is provided between the source electrode 16 and the drain electrode 18.

The second insulating layer 26 electrically isolates the source electrode 16 and the drain electrode 18. The second insulating layer 26 is, for example, an oxide, a nitride, or an oxynitride. The second insulating layer 26 is, for example, silicon oxide, silicon nitride, or silicon oxynitride.

Next, functions and effects of the semiconductor device according to the first embodiment will be described.

For example, when the oxide semiconductor transistor is applied to the switching transistor of the memory cell, the oxide semiconductor transistor undergoes a heat treatment associated with the formation of the memory cell or wiring. A threshold voltage of the oxide semiconductor transistor may fluctuate due to the heat treatment.

The fluctuation of the threshold voltage of the oxide semiconductor transistor occurs when oxygen in the oxide semiconductor layer provided with the channel out diffuse to the side of the source electrode or the drain electrode. Oxygen deficiency occurs in the oxide semiconductor layer due to the out diffusion of oxygen in the oxide semiconductor layer. The oxygen deficiency functions as a donor in the oxide semiconductor layer. Therefore, for example, when the oxide semiconductor transistor is an n-channel transistor, the threshold voltage of the oxide semiconductor transistor decreases.

The transistor 100 according to the first embodiment includes the barrier layer 20 suppressing the diffusion of oxygen between the oxide semiconductor layer 10 and the source electrode 16 and between the oxide semiconductor layer 10 and the drain electrode 18. By providing the barrier layer 20, oxygen in the oxide semiconductor layer 10 is suppressed from diffusing to the side of the source electrode 16 or the drain electrode 18. Therefore, the fluctuation of the threshold voltage of the transistor 100 is suppressed.

By containing the first metal element, the barrier layer 20 has reduced electric resistivity as compared with a case where the barrier layer 20 does not contain the first metal element, for example. Therefore, it is possible to suppress an increase in contact resistance by providing the barrier layer 20 between the oxide semiconductor layer 10 and the source electrode 16 and between the oxide semiconductor layer 10 and the drain electrode 18.

The transistor 100 according to the first embodiment includes the contact layer 22 between the oxide semiconductor layer 10 and the barrier layer 20. By providing the contact layer 22, for example, as compared with a case where the barrier layer 20 is in direct contact with the oxide semiconductor layer 10 without providing the contact layer 22, the contact resistance is reduced.

From the viewpoint of suppressing the diffusion of oxygen, the crystal grain size of the barrier layer 20 is preferably small. From the viewpoint of suppressing the diffusion of oxygen, the crystal grain size of the barrier layer 20 is preferably smaller than that of the contact layer 22. Further, from the viewpoint of suppressing the diffusion of oxygen, the barrier layer 20 is preferably amorphous.

From the viewpoint of suppressing the diffusion of oxygen, the barrier layer 20 is preferably an oxide.

From the viewpoint of suppressing the diffusion of oxygen, the barrier layer 20 is preferably an oxide containing silicon (Si). That is, the first element is preferably silicon (Si).

Further, from the viewpoint of suppressing the diffusion of oxygen, the barrier layer 20 is preferably an oxide containing silicon (Si) and zinc (Zn). That is, the first element is preferably silicon (Si) and zinc (Zn).

Further, from the viewpoint of reducing the electric resistivity of the barrier layer 20, the barrier layer 20 preferably contains titanium (Ti). That is, the first metal element is preferably titanium (Ti).

The thickness of the barrier layer 20 is preferably equal to or more than 5 nm and equal to or less than 30 nm, and is more preferably equal to or more than 8 nm and equal to or less than 20 nm. By exceeding the above lower limit, the effect of suppressing the diffusion of oxygen is improved. By falling below the above upper limit, the contact resistance is reduced.

The thickness of the barrier layer 20 is preferably more than that of the contact layer 22. The thickness of the barrier layer 20 is preferably 1.5 times or more the thickness of the contact layer 22.

From the viewpoint of reducing the contact resistance between the oxide semiconductor layer 10 and the contact layer 22, the contact layer 22 is preferably a metal oxide. Since the contact layer 22 is a metal oxide, it is possible to suppress the formation of a reaction product having high resistance by the heat treatment between the oxide semiconductor layer 10 and the contact layer 22.

From the viewpoint of suppressing the formation of the reaction product having the high resistance, the second element is preferably at least one of the elements contained in the oxide semiconductor layer 10.

From the viewpoint of reducing the contact resistance between the oxide semiconductor layer 10 and the contact layer 22, the contact layer 22 is preferably an oxide containing indium (In) and tin (Sn).

The thickness of the contact layer 22 is preferably equal to or more than 1 nm and equal to or less than 10 nm, and is more preferably equal to or more than 3 nm and equal to or less than 5 nm. By exceeding the above lower limit, the contact resistance between the oxide semiconductor layer 10 and the contact layer 22 can be reduced. Therefore, the contact resistance is reduced.

Further, by falling below the above upper limit, the electric resistance of the contact layer 22 can be reduced. Therefore, the contact resistance is reduced.

From the viewpoint of reducing heat resistance and resistance, the source electrode 16 and the drain electrode 18 are preferably metals containing tungsten (W) or molybdenum (Mo).

As described above, according to the first embodiment, the fluctuation of the threshold voltage after the heat treatment is suppressed, and an oxide semiconductor transistor having high heat resistance is realized.

Second Embodiment

A semiconductor device according to a second embodiment is different from the semiconductor device according to the first embodiment in that a third conductive layer is further provided, the third conductive layer being provided between a first electrode and a first conductive layer or between a second electrode and a first conductive layer, the third conductive layer containing a first metal element, and a concentration of the first metal element in the third conductive layer being higher than a concentration of the first metal element in the first conductive layer. Hereinafter, description of contents overlapping with those of the first embodiment may be partially omitted.

Figure 2:
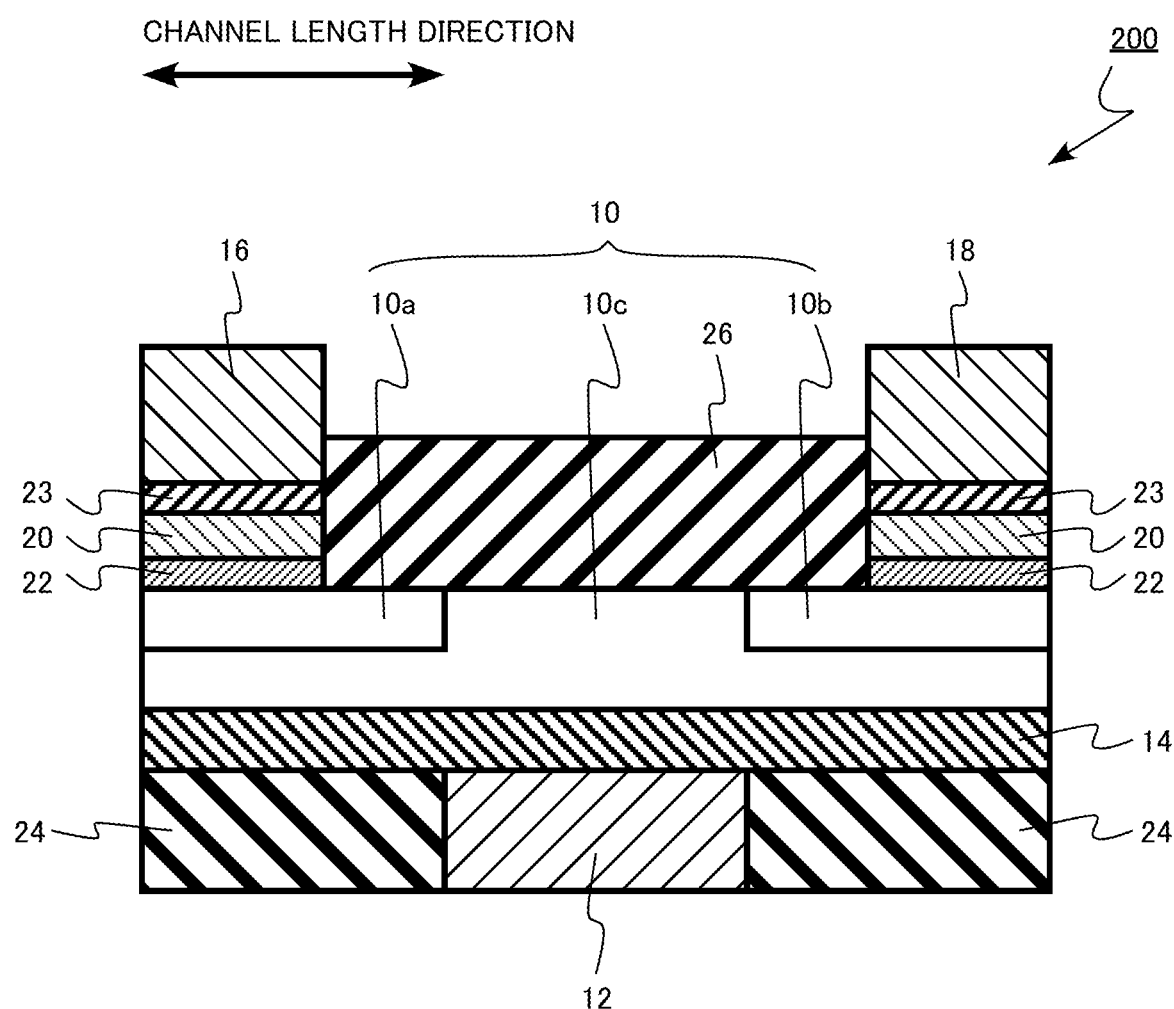
FIG. 2 is a schematic cross-sectional view of a semiconductor device according to a second embodiment.

FIG. 2 is a schematic cross-sectional view of the semiconductor device according to the second embodiment.

The semiconductor device according to the second embodiment is a transistor 200.

The transistor 200 includes an oxide semiconductor layer 10, a gate electrode 12, a gate insulating layer 14, a source electrode 16, a drain electrode 18, a barrier layer 20, a contact layer 22, a metal layer 23, a first insulating layer 24, and a second insulating layer 26.

The source electrode 16 is an example of a first electrode. The drain electrode 18 is an example of a second electrode. The barrier layer 20 is an example of a first conductive layer. The contact layer 22 is an example of a second conductive layer. The metal layer 23 is an example of a third conductive layer.

The oxide semiconductor layer 10 has a first region 10a, a second region 10b, and a third region 10c.

The metal layer 23 is provided between the source electrode 16 and the barrier layer 20 and between the drain electrode 18 and the barrier layer 20. The metal layer 23 is in contact with, for example, the source electrode 16 and the barrier layer 20. The metal layer 23 is in contact with, for example, the drain electrode 18 and the barrier layer 20. The metal layer 23 functions as a supply source of the first metal element contained in the barrier layer 20, for example, in the manufacturing of the transistor 200.

The metal layer 23 is a metal. The metal layer 23 contains the first metal element contained in the barrier layer 20. A concentration of the first metal element contained in the metal layer 23 is higher than a concentration of the first metal element contained in the barrier layer 20. The concentration of the first metal element contained in the metal layer 23 is, for example, equal to or more than 70 atomic % and equal to or less than 100 atomic %.

The first metal element is at least one element selected from the group consisting of, for example, titanium (Ti), silver (Ag), nickel (Ni), copper (Cu), and tantalum (Ta).

The metal layer 23 is a metal. The metal layer 23 contains, for example, titanium (Ti). The metal layer 23 is, for example, a titanium layer.

The thickness of the metal layer 23 is, for example, smaller than the thickness of the barrier layer 20. The thickness of the metal layer 23 is, for example, equal to or more than 1 nm and equal to or less than 10 nm.

A chemical composition of the barrier layer 20 is different from chemical compositions of the source electrode 16 and the drain electrode 18. The concentration of the first metal element contained in the source electrode 16 and the drain electrode 18 is, for example, equal to or less than 1 atomic %.

The transistor 200 according to the second embodiment is provided with the metal layer 23, so that it becomes easy to introduce the first metal element into the barrier layer 20.

As described above, according to the second embodiment, like the first embodiment, the fluctuation of a threshold voltage after the heat treatment is suppressed, and an oxide semiconductor transistor having high heat resistance is realized.

Third Embodiment

A semiconductor device according to a third embodiment is different from the semiconductor device according to the first embodiment in that a gate electrode surrounds an oxide semiconductor layer. Hereinafter, description of contents overlapping with those of the first embodiment may be partially omitted.

Figure 3:
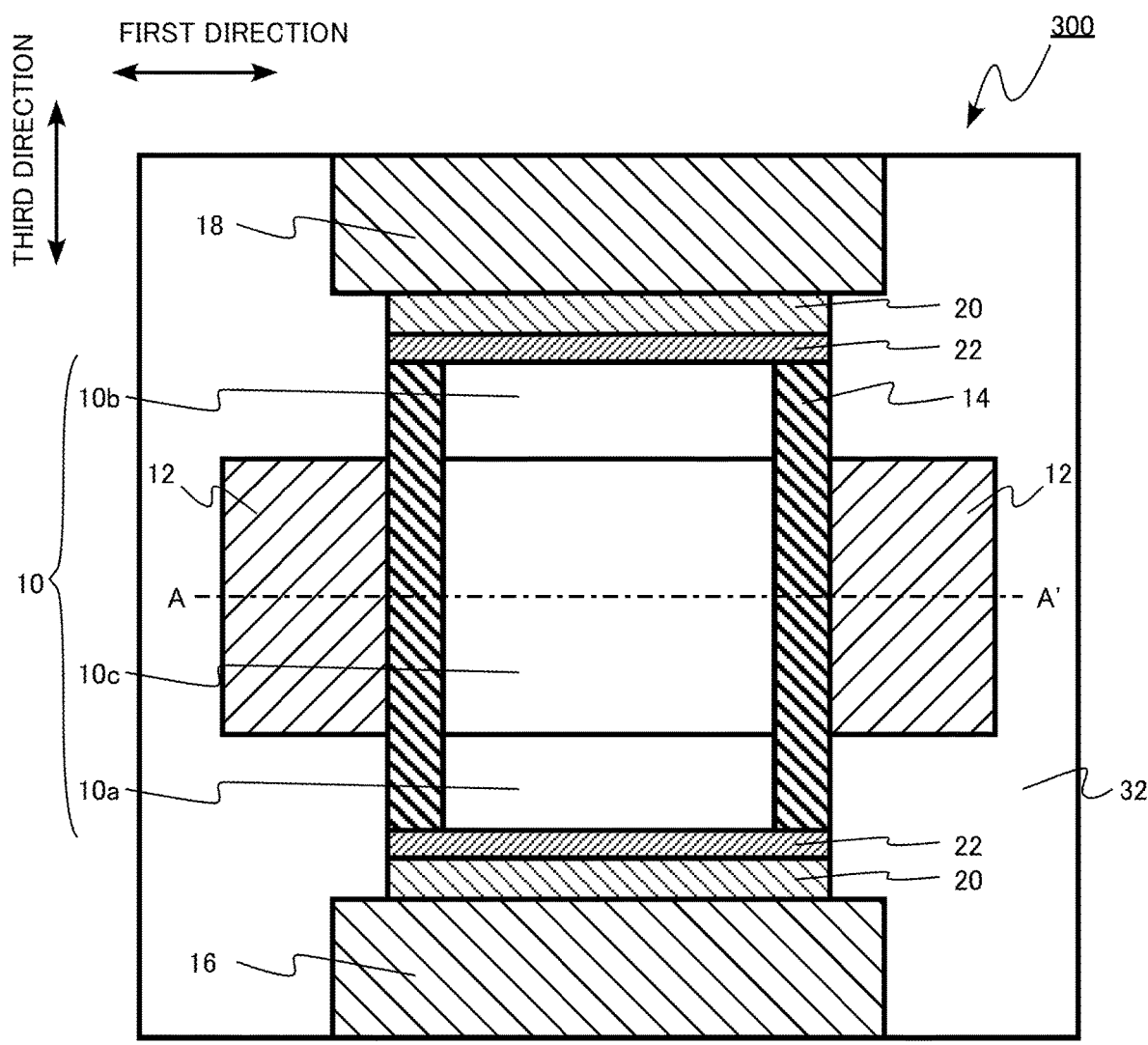
FIG. 3 is a schematic cross-sectional view of a semiconductor device according to a third embodiment.
Figure 4:
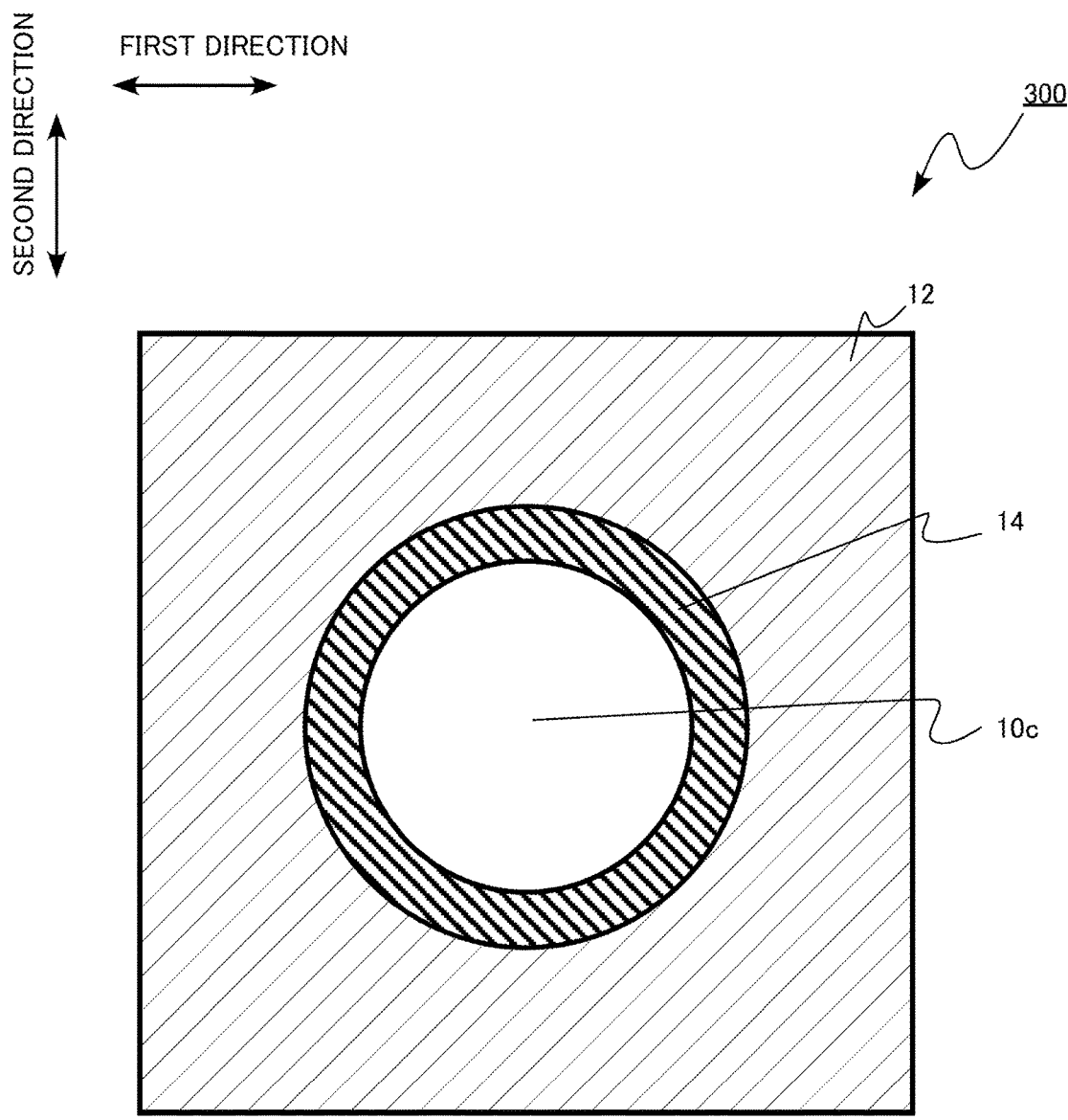
FIG. 4 is a schematic cross-sectional view of the semiconductor device according to the third embodiment.

FIGS. 3 and 4 are schematic cross-sectional views of the semiconductor device according to the third embodiment. FIG. 4 is a cross-sectional view taken along the line AA' of FIG. 3. In FIG. 3, a horizontal direction is referred to as a first direction, a depth direction is referred to as a second direction, and a vertical direction is referred to as a third direction.

The semiconductor device according to the third embodiment is a transistor 300. The transistor 300 is an oxide semiconductor transistor in which a channel is formed in an oxide semiconductor layer. The transistor 300 is a so-called surrounding gate transistor (SGT) in which a gate electrode is provided so as to surround the oxide semiconductor layer provided with the channel. The transistor 300 is a so-called vertical transistor.

The transistor 300 includes an oxide semiconductor layer 10, a gate electrode 12, a gate insulating layer 14, a source electrode 16, a drain electrode 18, a barrier layer 20, a contact layer 22, and an interlayer insulating layer 32. The source electrode 16 is an example of a first electrode. The drain electrode 18 is an example of a second electrode. The barrier layer 20 is an example of a first conductive layer. The contact layer 22 is an example of a second conductive layer.

The oxide semiconductor layer 10 has a first region 10a, a second region 10b, and a third region 10c.

The oxide semiconductor layer 10 is provided between the source electrode 16 and the drain electrode 18. The oxide semiconductor layer 10 is provided with a channel functioning as a current path when the transistor 300 is turned on. The oxide semiconductor layer 10 extends in a third direction. The oxide semiconductor layer 10 has a columnar shape extending in the third direction. The oxide semiconductor layer 10 has, for example, a cylindrical shape.

A direction in which electrons flow in the channel is called a channel length direction. The third direction is the channel length direction of the transistor 300.

The oxide semiconductor layer 10 is an oxide semiconductor. The oxide semiconductor layer 10 is a metal oxide. The oxide semiconductor layer 10 is, for example, amorphous.

The oxide semiconductor layer 10 contains, for example, indium (In), gallium (Ga), and zinc (Zn). A total atomic ratio of indium, gallium, and zinc among the metal elements contained in the oxide semiconductor layer 10 is, for example, equal to or more than 90%. Further, the total atomic ratio of indium, gallium, and zinc among the elements other than oxygen contained in the oxide semiconductor layer 10 is, for example, equal to or more than 90%. For example, in the oxide semiconductor layer 10, there is no element other than oxygen having an atomic ratio larger than that of any one of indium, gallium, and zinc.

The oxide semiconductor layer 10 has a first region 10a, a second region 10b, and a third region 10c. At least a part of the third region 10c is provided between the first region 10a and the second region 10b.

The first region 10a functions as a source region of the transistor 300, and the second region 10b functions as a drain region of the transistor 300. Further, a channel is formed in the third region 10c when the transistor 300 is turned on.

The first region 10a and the second region 10b are, for example, n-type semiconductors. An oxygen deficiency concentration in the first region 10a and an oxygen deficiency concentration in the second region 10b are higher than, for example, an oxygen deficiency concentration in the third region 10c. The oxygen deficiency in the oxide semiconductor layer 10 functions as a donor.

An n-type carrier concentration in the first region 10a and an n-type carrier concentration in the second region 10b are higher than, for example, an n-type carrier concentration in the third region 10c. An electric resistance of the first region 10a and an electric resistance of the second region 10b are lower than, for example, an electric resistance of the third region 10c.

A width of the oxide semiconductor layer 10 in the first direction is, for example, equal to or more than 20 nm and equal to or less than 100 nm. A length of the oxide semiconductor layer 10 in the third direction is, for example, equal to or more than 80 nm and equal to or less than 200 nm.

The oxide semiconductor layer 10 is formed by, for example, an ALD method.

The gate electrode 12 is provided so as to surround the oxide semiconductor layer 10. The gate electrode 12 is provided around the oxide semiconductor layer 10.

The gate electrode 12 is, for example, a metal, a metal compound, or a semiconductor. The gate electrode 12 is, for example, tungsten (W). A gate length of the gate electrode 12 is, for example, equal to or more than 20 nm and equal to or less than 100 nm. The gate length of the gate electrode 12 is the length of the gate electrode 12 in the third direction.

The gate insulating layer 14 is provided between the oxide semiconductor layer 10 and the gate electrode 12. The gate insulating layer 14 is provided so as to surround the oxide semiconductor layer 10. The gate insulating layer 14 is provided at least between the third region 10c and the gate electrode 12.

The gate insulating layer 14 is, for example, an oxide or an oxynitride. The gate insulating layer 14 is, for example, silicon oxide or aluminum oxide. A thickness of the gate insulating layer 14 is, for example, equal to or more than 2 nm and equal to or less than 10 nm.

Note that an oxide layer (not shown) of a material different from that of the gate insulating layer 14 can be provided between the oxide semiconductor layer 10 and the gate insulating layer 14.

The source electrode 16 is electrically connected to the oxide semiconductor layer 10 at a first position of the oxide semiconductor layer 10. The first position is, for example, a position where the contact layer 22 between the source electrode 16 and the oxide semiconductor layer 10 is in contact with the oxide semiconductor layer 10.

The source electrode 16 is provided below the oxide semiconductor layer 10. The source electrode 16 is provided below the first region 10a. The source electrode 16 is electrically connected to the first region 10a.

The source electrode 16 is, for example, a metal or a metal compound. The source electrode 16 is, for example, tungsten (W) or molybdenum (Mo).

The drain electrode 18 is electrically connected to the oxide semiconductor layer 10 at a second position of the oxide semiconductor layer 10. The second position is, for example, a position where the contact layer 22 between the drain electrode 18 and the oxide semiconductor layer 10 is in contact with the oxide semiconductor layer 10.

The second position is disposed in the channel length direction with respect to the first position.

A third position of the oxide semiconductor layer 10 facing the gate electrode 12 is disposed between the first position and the second position in the channel length direction. In other words, when coordinate axes extending in the channel length direction are considered, a coordinate value of the third position is a value between a coordinate value of the first position and a coordinate value of the second position. A position of the channel length direction of a portion of the oxide semiconductor layer 10 facing the gate electrode 12 with the gate insulating layer 14 therebetween is a position between the first position and the second position. In other words, when coordinate axes extending in the channel length direction are considered, a coordinate value of the position of the channel length direction of the portion of the oxide semiconductor layer 10 facing the gate electrode 12 with the gate insulating layer 14 therebetween is a value between a coordinate value of the first position and a coordinate value of the second position.

The drain electrode 18 is provided above the oxide semiconductor layer 10. The drain electrode 18 is provided above the second region 10b. The drain electrode 18 is electrically connected to the second region 10b.

The drain electrode 18 is, for example, a metal or a metal compound. The source electrode 16 is, for example, tungsten (W) or molybdenum (Mo).

The barrier layer 20 is provided between the oxide semiconductor layer 10 and the source electrode 16. The barrier layer 20 is provided between the first region 10a and the source electrode 16. The barrier layer 20 is in contact with, for example, the source electrode 16. The barrier layer 20 functions as a diffusion barrier for oxygen diffusing from the oxide semiconductor layer 10 to the side of the source electrode 16.

The barrier layer 20 is provided between the oxide semiconductor layer 10 and the drain electrode 18. The barrier layer 20 is provided between the second region 10b and the drain electrode 18. The barrier layer 20 is in contact with, for example, the drain electrode 18. The barrier layer 20 functions as a diffusion barrier for oxygen diffusing from the oxide semiconductor layer 10 to the side of the drain electrode 18.

The barrier layer 20 contains a first metal element, a first element different from the first metal element, and at least one element of oxygen (O) or nitrogen (N). As the first element, two or more kinds of first elements may be contained.

The first metal element is at least one element selected from the group consisting of, for example, titanium (Ti), silver (Ag), nickel (Ni), copper (Cu), and tantalum (Ta). Further, the first element is at least one element selected from the group consisting of, for example, zinc (Zn), silicon (Si), aluminum (Al), tin (Sn), gallium (Ga), hafnium (Hf), lantern (La), and cerium (Ce).

The barrier layer 20 is, for example, an oxide, a nitride, or an oxynitride.

The barrier layer 20 is, for example, an oxide containing titanium (Ti) as the first metal element and zinc (Zn) and silicon (Si) as the first element.

A concentration of the first metal element contained in the barrier layer 20 is, for example, equal to or more than 3 atomic % and equal to or less than 30 atomic %.

The thickness of the barrier layer 20 is more than the thickness of the contact layer 22, for example. Each of the thickness of the barrier layer 20 and the thickness of the contact layer 22 is the thickness in a direction from the oxide semiconductor layer 10 toward the source electrode 16.

The thickness of the barrier layer 20 is, for example, 1.5 times or more the thickness of the contact layer 22. The thickness of the barrier layer 20 is, for example, equal to or more than 5 nm and equal to or less than 30 nm.

The barrier layer 20 is, for example, crystalline. The crystal grain size of the barrier layer 20 is smaller than, for example, the crystal grain size of the contact layer 22. The crystal grain size of each of the barrier layer 20 and the contact layer 22 is represented by, for example, a median value of a major axis of crystal grains.

The barrier layer 20 is, for example, amorphous.

The contact layer 22 is provided between the oxide semiconductor layer 10 and the barrier layer 20. The contact layer 22 is provided between the first region 10a and the source electrode 16. Further, the contact layer 22 is provided between the second region 10b and the drain electrode 18.

The contact layer 22 is in contact with, for example, the barrier layer 20. The contact layer 22 is in contact with, for example, the oxide semiconductor layer 10. The contact layer 22 is in contact with, for example, the first region 10a. The contact layer 22 is in contact with, for example, the second region 10b.

The contact layer 22 has a function of reducing the resistance between the first region 10a and the source electrode 16. The contact layer 22 has a function of reducing the resistance between the second region 10b and the drain electrode 18.

The contact layer 22 contains a second element different from both of the first metal element and the first element. As the second element, two or more kinds of second elements may be contained. The contact layer 22 contains oxygen (O).

The second element is at least one element selected from the group consisting of, for example, indium (In), zinc (Zn), tin (Sn), and cadmium (Cd).

The contact layer 22 is, for example, a metal oxide.

The contact layer 22 contains, for example, indium (In) and tin (Sn) as the second element. The contact layer 22 is, for example, an oxide containing indium (In) and tin (Sn).

The thickness of the contact layer 22 is, for example, equal to or more than 1 nm and equal to or less than 10 nm. The contact layer 22 is, for example, crystalline.

The interlayer insulating layer 32 is provided around the gate electrode 12, the source electrode 16, and the drain electrode 18. The interlayer insulating layer 32 is, for example, an oxide, a nitride, or an oxynitride. The interlayer insulating layer 32 is, for example, silicon oxide, silicon nitride, or silicon oxynitride.

Note that the same metal layer as that described in the second embodiment can be provided between the source electrode 16 and the barrier layer 20 and between the drain electrode 18 and the barrier layer 20.

As described above, according to the third embodiment, like the first embodiment, the fluctuation of a threshold voltage after the heat treatment is suppressed, and an oxide semiconductor transistor having high heat resistance is realized. Further, according to the third embodiment, with the SGT, it is possible to dispose transistors at a high density per unit area.

Fourth Embodiment

A semiconductor memory device according to a fourth embodiment includes: a first wire extending in a first direction; a second wire extending in a second direction intersecting the first direction; and a memory cell. The memory cell includes: an oxide semiconductor layer electrically connected to the first wire, the oxide semiconductor layer being surrounded by a part of the second wire; a gate insulating layer provided between the oxide semiconductor layer and the part of the second wire; a capacitor electrically connected to the oxide semiconductor layer; a first conductive layer provided at at least one position between the oxide semiconductor layer and the first wire or between the oxide semiconductor layer and the capacitor, the first conductive layer containing a first metal element, a first element different from the first metal element, and at least one element of oxygen (O) or nitrogen (N); and a second conductive layer provided between the oxide semiconductor layer and the first conductive layer, the second conductive layer containing a second element different from the first metal element and the first element, and oxygen (O). Hereinafter, description of contents overlapping with those of the first to third embodiments may be partially omitted.

The semiconductor memory device according to the fourth embodiment is a semiconductor memory 400. The semiconductor memory device according to the fourth embodiment is a dynamic random access memory (DRAM). The semiconductor memory 400 uses the transistor 300 according to the third embodiment as a switching transistor of a memory cell of the DRAM.

Figure 5:
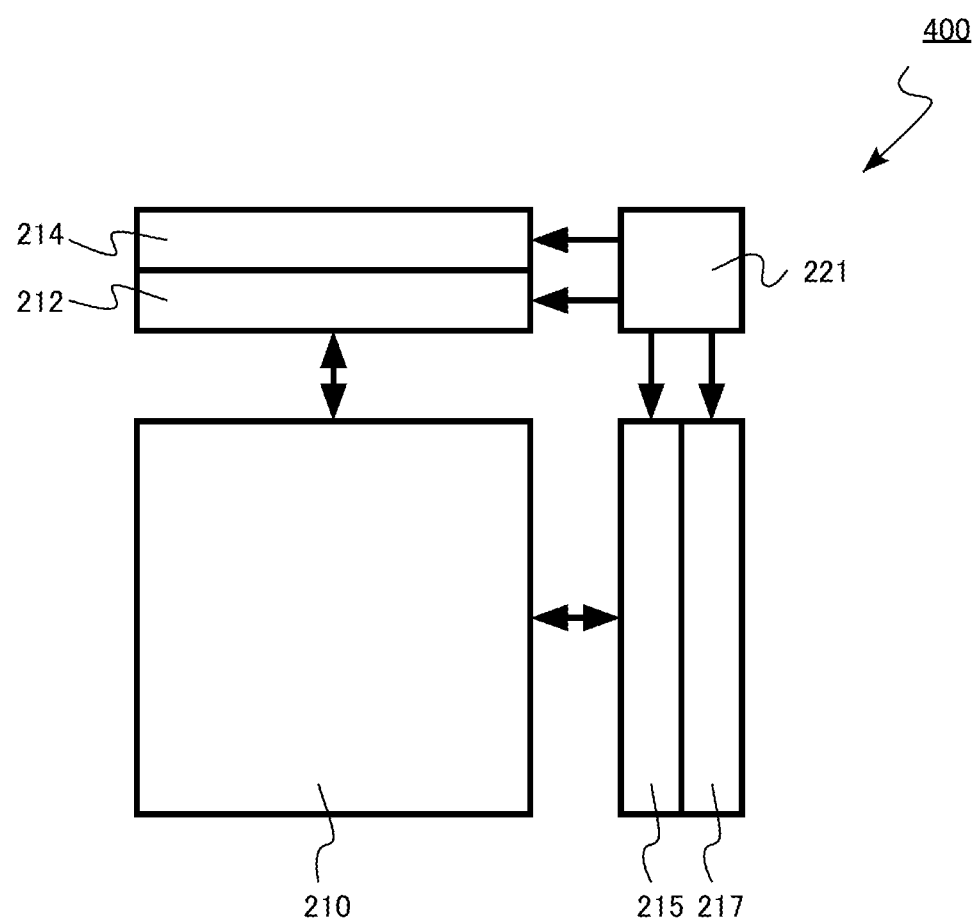
FIG. 5 is a block diagram of a semiconductor memory device according to a fourth embodiment.

FIG. 5 is a block diagram of the semiconductor memory device according to the fourth embodiment.

As shown in FIG. 5, the semiconductor memory 400 includes a memory cell array 210, a word line driver circuit 212, a row decoder circuit 214, a sense amplifier circuit 215, a column decoder circuit 217, and a control circuit 221.

Figure 6:
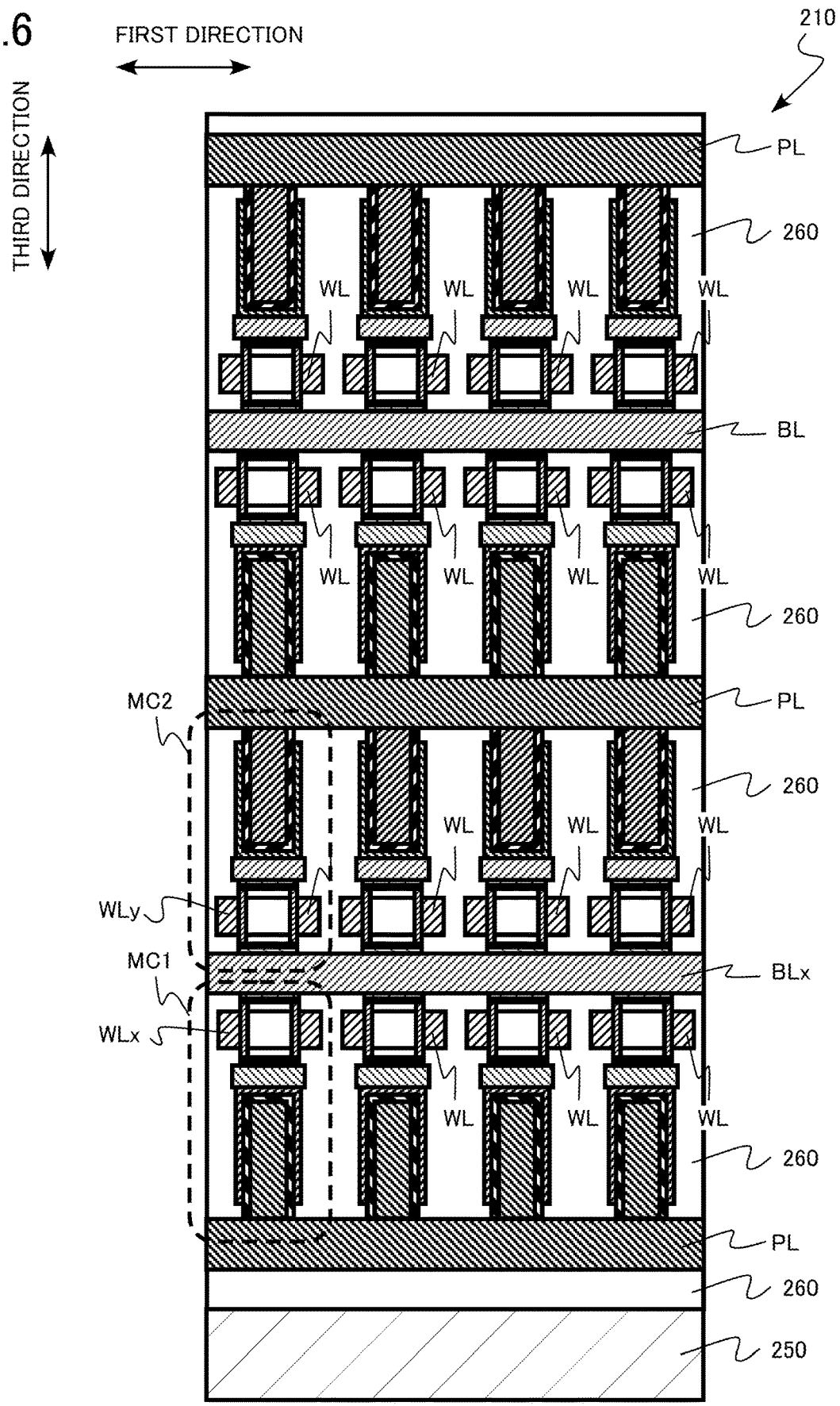
FIG. 6 is a schematic cross-sectional view of a memory cell array of the semiconductor memory device according to the fourth embodiment.
Figure 7:
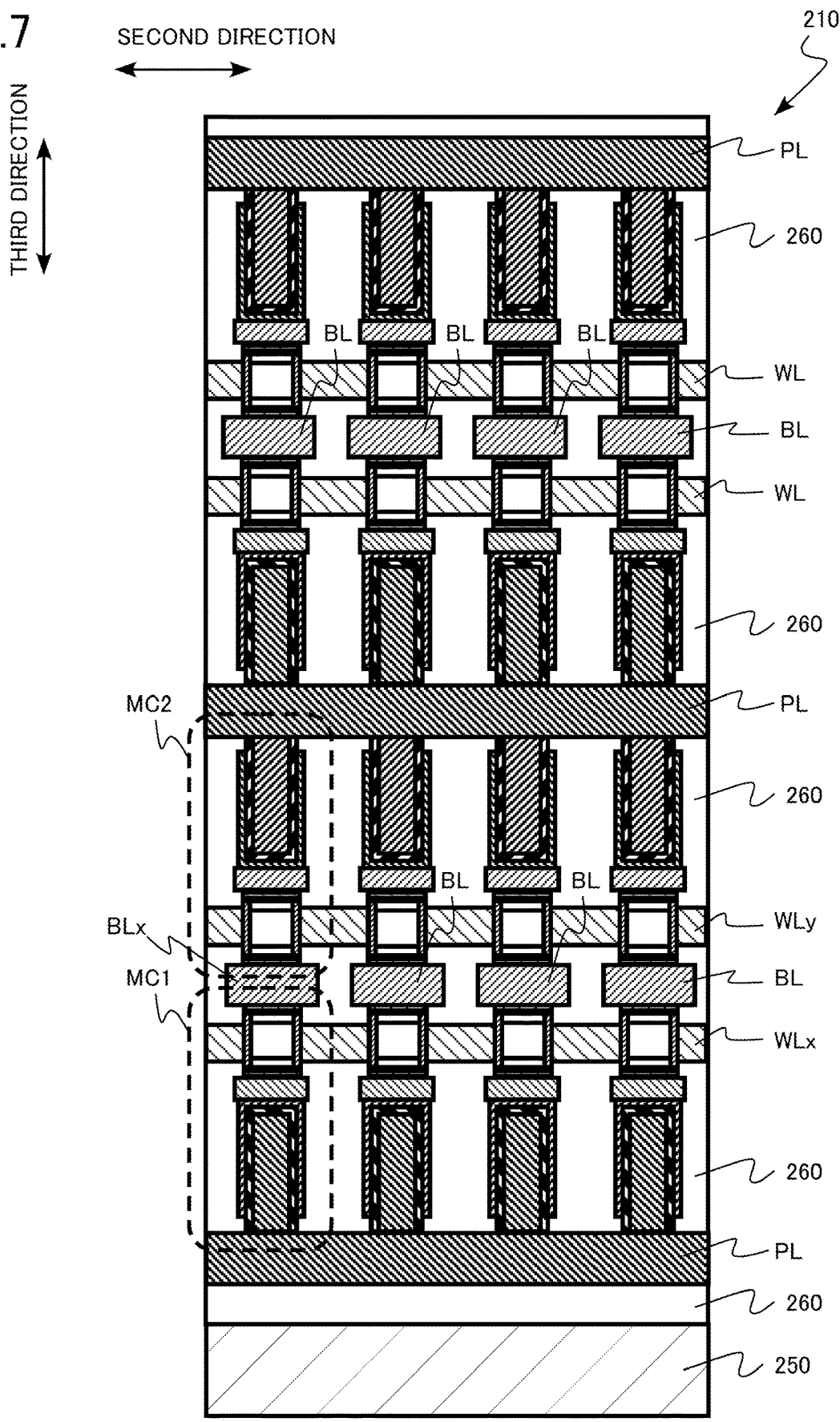
FIG. 7 is a schematic cross-sectional view of the memory cell array of the semiconductor memory device according to the fourth embodiment.

FIGS. 6 and 7 are schematic cross-sectional views of the memory cell array of the semiconductor memory device according to the fourth embodiment. FIG. 6 is a cross-sectional view of a plane including a first direction and a third direction, and FIG. 7 is a cross-sectional view of a plane including a second direction and the third direction. The first direction and the second direction intersect. The first direction and the second direction are, for example, vertical. The third direction is a direction perpendicular to the first direction and the second direction. The third direction is, for example, a direction perpendicular to a substrate.

The memory cell array 210 of the fourth embodiment has a three-dimensional structure in which memory cells are three-dimensionally disposed. Each of regions surrounded by broken lines in FIGS. 6 and 7 represents one memory cell.

The memory cell array 210 includes a silicon substrate 250.

The memory cell array 210 includes, for example, a plurality of bit lines BL and a plurality of word lines WL on the silicon substrate 250. The bit line BL extends in the first direction. The word line WL extends in the second direction.

The bit line BL and the word line WL intersect, for example, vertically. Memory cells are disposed in regions where the bit lines BL and the word lines WL intersect, respectively. The memory cells include first memory cells MC1 and second memory cells MC2. Each of the first memory cell MC1 and the second memory cell MC2 is an example of the memory cell.

The bit line BL connected to the first memory cell MC1 and the second memory cell MC2 is a bit line BLx. The bit line BLx is an example of a first wire. The word line WL connected to the first memory cell MC1 is a word line WLx. The word line WLx is an example of a second wire.

The word line WL connected to the second memory cell MC2 is a word line WLy. The word line WLx is provided on one side of the bit line BLx. The word line WLy is provided on the other side of the bit line BLx.

The memory cell array 210 has a plurality of plate electrode wires PL. The plate electrode wire PL is connected to a plate electrode 72 of each memory cell.

The memory cell array 210 includes interlayer insulating layers 260 for electric isolation of each wire and each electrode.

The plurality of word lines WL are electrically connected to the row decoder circuit 214. The plurality of bit lines BL are electrically connected to the sense amplifier circuit 215.

The row decoder circuit 214 has a function of selecting the word line WL according to an input row address signal. The word line driver circuit 212 has a function of applying a predetermined voltage to the word line WL selected by the row decoder circuit 214.

The column decoder circuit 217 has a function of selecting the bit line BL according to an input column address signal. The sense amplifier circuit 215 has a function of applying a predetermined voltage to the bit line BL selected by the column decoder circuit 217. Further, the sense amplifier circuit 215 has a function of detecting and amplifying an electric potential of the bit line BL.

The control circuit 221 has a function of controlling the word line driver circuit 212, the row decoder circuit 214, the sense amplifier circuit 215, the column decoder circuit 217, and other circuits (not shown).

Circuits such as the word line driver circuit 212, the row decoder circuit 214, the sense amplifier circuit 215, the column decoder circuit 217, and the control circuit 221 are formed using, for example, transistors and wiring layers (not shown). The transistor is formed using, for example, the silicon substrate 250.

The bit line BL and the word line WL are, for example, metals. The bit line BL and the word line WL are, for example, titanium nitride, tungsten, or a stacked structure of titanium nitride and tungsten.

Figure 8:
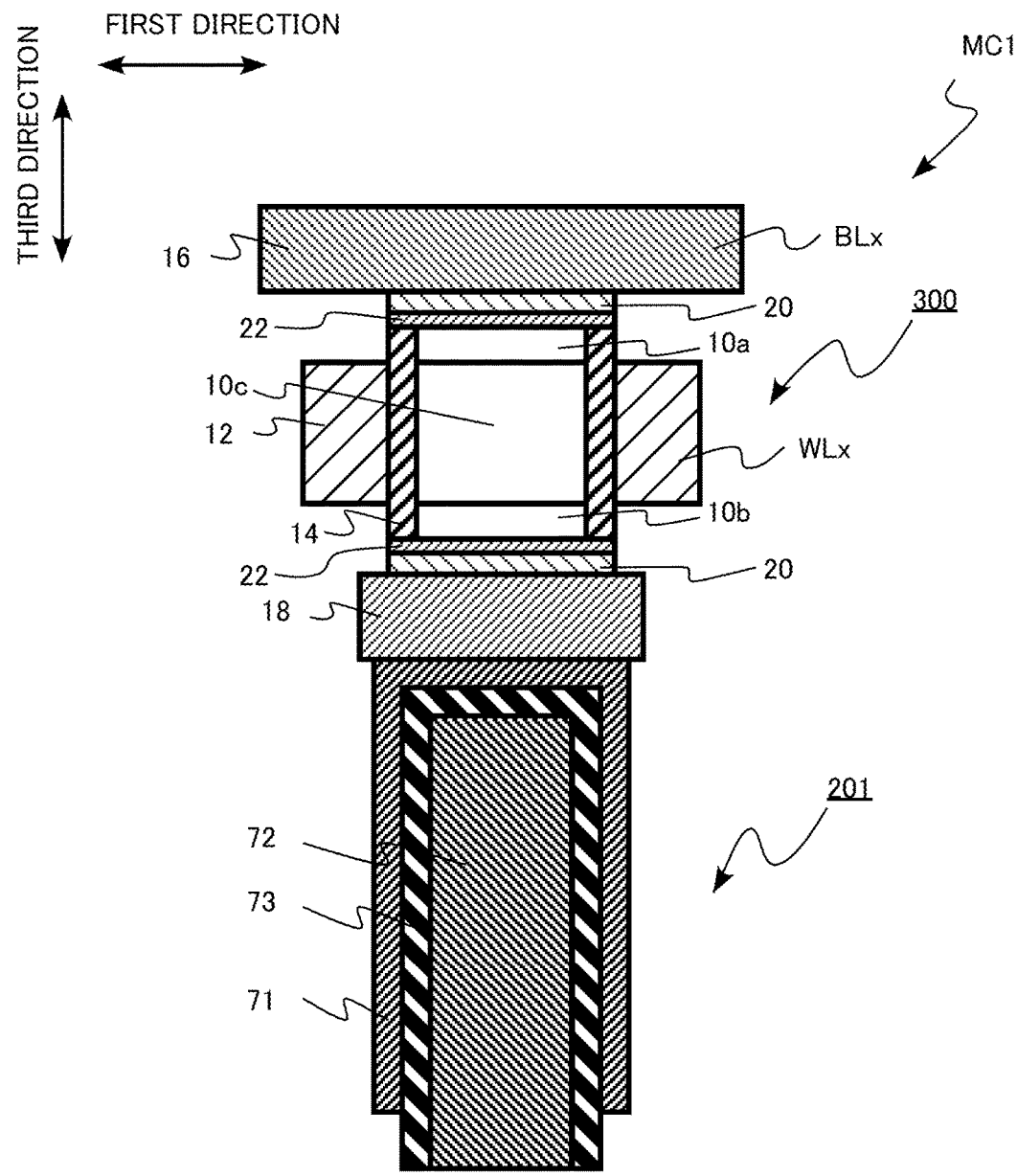
FIG. 8 is a schematic cross-sectional view of a first memory cell of the semiconductor memory device according to the fourth embodiment.
Figure 9:
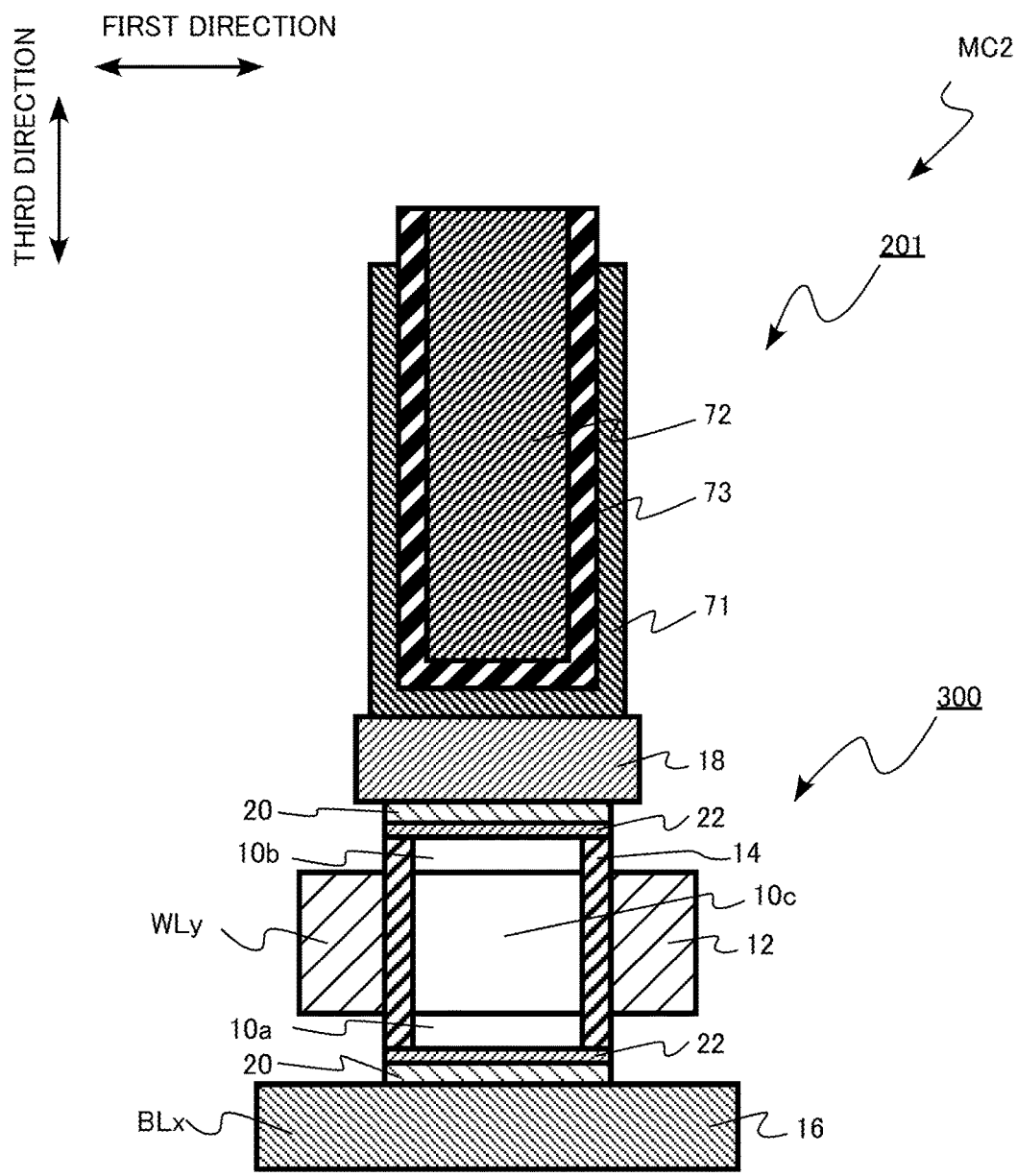
FIG. 9 is a schematic cross-sectional view of a second memory cell of the semiconductor memory device according to the fourth embodiment.

FIG. 8 is a schematic cross-sectional view of the first memory cell of the semiconductor memory device according to the fourth embodiment. FIG. 9 is a schematic cross-sectional view of the second memory cell of the semiconductor memory device according to the fourth embodiment.

The first memory cell MC1 is provided between the silicon substrate 250 and the bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a structure in which the first memory cell MC1 is vertically inverted. Each of the first memory cell MC1 and the second memory cell MC2 includes a transistor 300 and a capacitor 201.

The transistor 300 includes an oxide semiconductor layer 10, a gate electrode 12, a gate insulating layer 14, a source electrode 16, a drain electrode 18, a barrier layer 20, and a contact layer 22. The source electrode 16 is an example of a first electrode. The drain electrode 18 is an example of a second electrode. The barrier layer 20 is an example of a first conductive layer. The contact layer 22 is an example of a second conductive layer. The transistor 300 has the same configuration as the transistor 300 according to the third embodiment.

The oxide semiconductor layer 10 is electrically connected to the bit line BLx. The oxide semiconductor layer 10 is surrounded by a part of the word line WL. A part of the word line WL surrounding the oxide semiconductor layer 10 is the gate electrode 12.

The oxide semiconductor layer 10 has a first region 10a, a second region 10b, and a third region 10c.

The capacitor 201 includes a cell electrode 71, a plate electrode 72, and a capacitor insulating film 73. The cell electrode 71 and the plate electrode 72 are, for example, titanium nitride. Further, the capacitor insulating film 73 has, for example, a stacked structure of zirconium oxide, aluminum oxide, and zirconium oxide.

The capacitor 201 is electrically connected to one end of the oxide semiconductor layer 10 of each of the first memory cell MC1 and the second memory cell MC2. The cell electrode 71 of the capacitor 201 is connected to the drain electrode 18. The plate electrode 72 is connected to the plate electrode wire PL.

The source electrode 16 is connected to the bit line BL. The gate electrode 12 is connected to the word line WL. The gate electrode 12 is a part of the word line WL.

In FIGS. 6, 7, 8, and 9, a case where the bit line BL and the source electrode 16, and the word line WL and the gate electrode 12 are simultaneously formed of the same material is shown as an example. The bit line BL and the source electrode 16, and the word line WL and the gate electrode 12 may be separately formed of different materials.

The bit line BLx is electrically connected to an end (the other end) opposite to an end of the oxide semiconductor layer 10 of the first memory cell MC1 to which the capacitor 201 is connected. The bit line BLx is electrically connected to an end (the other end) opposite to an end of the oxide semiconductor layer 10 of the second memory cell MC2 to which the capacitor 201 is connected.

The word line WLx is electrically connected to the gate electrode 12 of the first memory cell MC1. Further, the word line WLy is electrically connected to the gate electrode 12 of the second memory cell MC2.

The transistor 300 includes the barrier layer 20 between the oxide semiconductor layer 10 and the source electrode 16 and the drain electrode 18. Further, the contact layer 22 is provided between the oxide semiconductor layer 10 and the barrier layer 20.

When the oxide semiconductor transistor is used as the switching transistor of the memory cell of the DRAM, a high-temperature and long-time heat treatment is applied after the transistor is formed. The heat treatment is, for example, a heat treatment for forming the capacitor. A threshold voltage of the oxide semiconductor transistor tends to fluctuate due to the high-temperature and long-time heat treatment.

The transistor 300 includes the barrier layer 20 between the oxide semiconductor layer 10 and the source electrode 16 and the drain electrode 18. Therefore, even if the high-temperature and long-time heat treatment is applied after the transistor is formed, the fluctuation of the threshold voltage is suppressed.

Further, the transistor 300 includes the contact layer 22 between the oxide semiconductor layer 10 and the barrier layer 20. Therefore, the contact resistance is reduced. As a result, an on-current of the transistor 300 increases.

According to the fourth embodiment, by using the transistor 300 according to the third embodiment as the switching transistor of the DRAM, the fluctuation of the threshold voltage after the heat treatment is suppressed, and a semiconductor memory having high heat resistance is realized.

Fifth Embodiment

A semiconductor device according to a fifth embodiment includes: an oxide semiconductor layer; an electrode; a first conductive layer provided between the oxide semiconductor layer and the electrode, the first conductive layer containing a first metal element, a first element different from the first metal element, and at least one element of oxygen (O) or nitrogen (N); and a second conductive layer provided between the oxide semiconductor layer and the first conductive layer, the second conductive layer containing a second element different from the first metal element and the first element, and oxygen (O). Hereinafter, description of contents overlapping with those of the first embodiment may be partially omitted.

Figure 10:
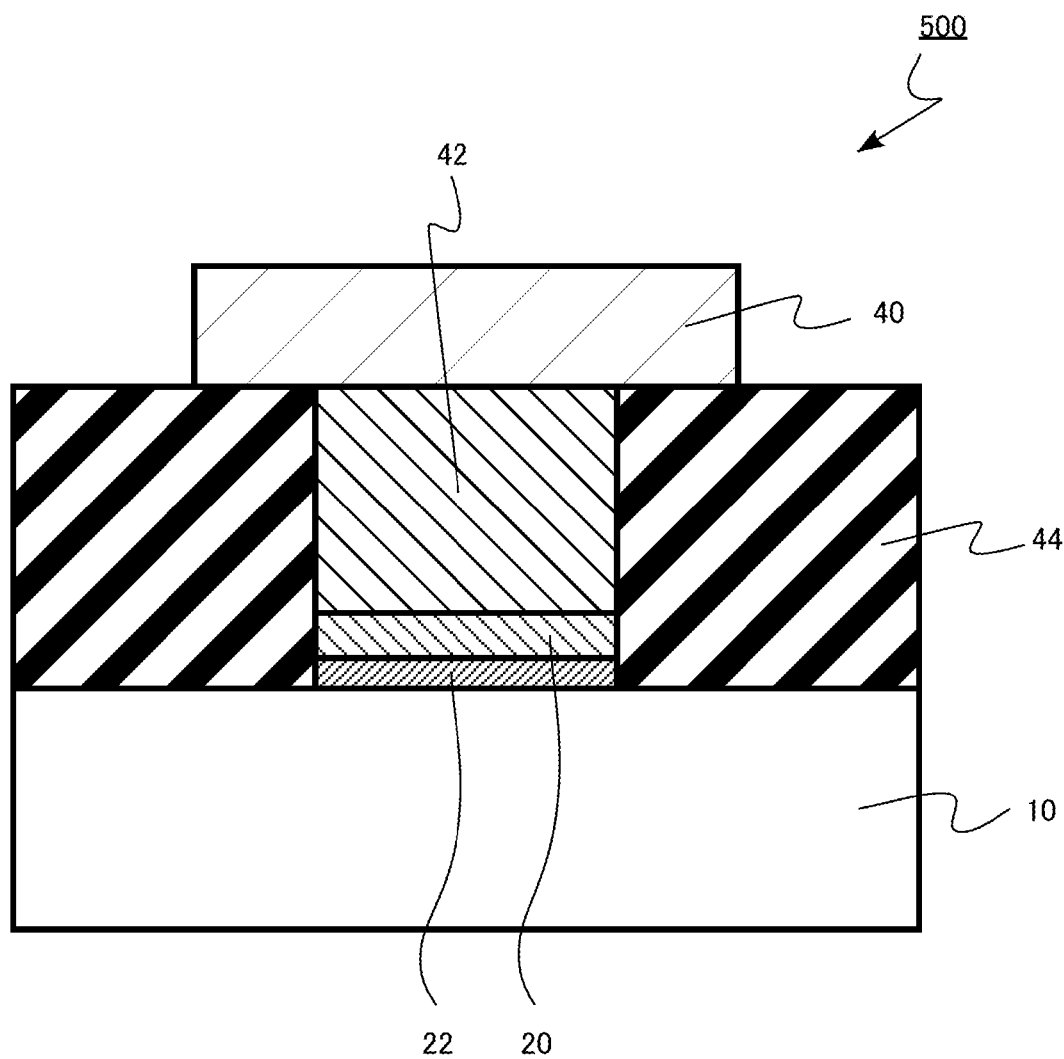
FIG. 10 is a schematic cross-sectional view of a semiconductor device according to a fifth embodiment.

FIG. 10 is a schematic cross-sectional view of the semiconductor device according to the fifth embodiment.

The semiconductor device according to the fifth embodiment includes a contact structure 500. The contact structure 500 includes an oxide semiconductor layer 10, a barrier layer 20, a contact layer 22, a wiring layer 40, a contact plug 42, and an interlayer insulating layer 44. The barrier layer 20 is an example of a first conductive layer. The contact layer 22 is an example of a second conductive layer. The contact plug 42 is an example of an electrode.

The oxide semiconductor layer 10 is an oxide semiconductor. The oxide semiconductor layer 10 is a metal oxide. The oxide semiconductor layer 10 is, for example, amorphous.

The oxide semiconductor layer 10 contains, for example, indium (In), gallium (Ga), and zinc (Zn). A total atomic ratio of indium, gallium, and zinc among first metal elements contained in the oxide semiconductor layer 10 is, for example, equal to or more than 90%. Further, the total atomic ratio of indium, gallium, and zinc among the elements other than oxygen contained in the oxide semiconductor layer 10 is, for example, equal to or more than 90%. For example, in the oxide semiconductor layer 10, there is no element other than oxygen having an atomic ratio larger than that of any one of indium, gallium, and zinc.

The wiring layer 40 is, for example, a metal or a metal compound.

The contact plug 42 is provided between the oxide semiconductor layer 10 and the wiring layer 40. The contact plug 42 contains a metal. The contact plug 42 is, for example, a metal or a metal compound. The contact plug 42 is, for example, tungsten (W) or molybdenum (Mo).

The barrier layer 20 is provided between the oxide semiconductor layer 10 and the contact plug 42. The barrier layer 20 is in contact with, for example, the contact plug 42. The barrier layer 20 functions as a diffusion barrier for oxygen diffusing from the oxide semiconductor layer 10 to the side of the contact plug 42.

The barrier layer 20 contains a first metal element, a first element different from the first metal element, and at least one element of oxygen (O) or nitrogen (N). As the first element, two or more kinds of first elements may be contained.

The first metal element is at least one element selected from the group consisting of, for example, titanium (Ti), silver (Ag), nickel (Ni), copper (Cu), and tantalum (Ta). Further, the first element is at least one element selected from the group consisting of, for example, zinc (Zn), silicon (Si), aluminum (Al), tin (Sn), gallium (Ga), hafnium (Hf), lantern (La), and cerium (Ce).

The barrier layer 20 is, for example, an oxide, a nitride, or an oxynitride.

The barrier layer 20 is, for example, an oxide containing titanium (Ti) as the first metal element and zinc (Zn) and silicon (Si) as the first element.

A concentration of the first metal element contained in the barrier layer 20 is, for example, equal to or more than 3 atomic % and equal to or less than 30 atomic %.

The thickness of the barrier layer 20 is more than the thickness of the contact layer 22, for example. Each of the thickness of the barrier layer 20 and the thickness of the contact layer 22 is the thickness in a direction from the oxide semiconductor layer 10 toward the contact plug 42.

The thickness of the barrier layer 20 is, for example, 1.5 times or more the thickness of the contact layer 22. The thickness of the barrier layer 20 is, for example, equal to or more than 5 nm and equal to or less than 30 nm.

The barrier layer 20 is, for example, crystalline. The crystal grain size of the barrier layer 20 is smaller than, for example, the crystal grain size of the contact layer 22. The crystal grain size of each of the barrier layer 20 and the contact layer 22 is represented by, for example, a median value of a major axis of crystal grains.

The barrier layer 20 is, for example, amorphous.

The contact layer 22 is provided between the oxide semiconductor layer 10 and the barrier layer 20. The contact layer 22 is in contact with, for example, the barrier layer 20. The contact layer 22 is in contact with, for example, the oxide semiconductor layer 10.

The contact layer 22 has a function of reducing the resistance between the oxide semiconductor layer 10 and the contact plug 42.

The contact layer 22 contains a second element different from both of the first metal element and the first element. As the second element, two or more kinds of second elements may be contained. The contact layer 22 contains oxygen (O).

The second element is at least one element selected from the group consisting of, for example, indium (In), zinc (Zn), tin (Sn), and cadmium (Cd).

The contact layer 22 is, for example, a metal oxide.

The contact layer 22 contains, for example, indium (In) and tin (Sn) as the second element. The contact layer 22 is, for example, an oxide containing indium (In) and tin (Sn).

The thickness of the contact layer 22 is, for example, equal to or more than 1 nm and equal to or less than 10 nm. The contact layer 22 is, for example, crystalline.

The interlayer insulating layer 44 is provided between the oxide semiconductor layer 10 and the wiring layer 40. The interlayer insulating layer 44 is, for example, silicon oxide, silicon nitride, or silicon oxynitride.

When the contact structure 500 does not include the barrier layer 20, the contact plug 42 is oxidized by the heat treatment applied after the contact structure 500 is formed. That is, oxygen contained in the oxide semiconductor layer 10 diffuses into the contact plug 42, the metal forming the contact plug 42 is oxidized, and a metal oxide layer is formed.

The metal oxide layer is formed between the oxide semiconductor layer 10 and the contact plug 42, so that contact resistance between the oxide semiconductor layer 10 and the contact plug 42 increases.

The contact structure 500 includes the barrier layer 20 between the oxide semiconductor layer 10 and the contact plug 42. By providing the barrier layer 20, oxidation of the contact plug 42 is suppressed. Therefore, an increase in the contact resistance between the oxide semiconductor layer 10 and the contact plug 42 is suppressed.

Further, the contact structure 500 includes the contact layer 22 between the oxide semiconductor layer 10 and the barrier layer 20. Therefore, the contact resistance between the oxide semiconductor layer 10 and the contact plug 42 is reduced.

Note that the same metal layer as that described in the second embodiment can be provided between the contact plug 42 and the barrier layer 20.

As described above, according to the fifth embodiment, an increase in the contact resistance after the heat treatment is suppressed, and a semiconductor device having high heat resistance is realized.

In the first to fourth embodiments, the transistor in which the barrier layer 20 and the contact layer 22 are provided at both positions between the first region 10a and the source electrode 16 and between the second region 10b and the drain electrode 18 has been described as an example. However, a transistor in which the barrier layer 20 and the contact layer 22 are provided only at one of the positions between the first region 10a and the source electrode 16 and between the second region 10b and the drain electrode 18 can be configured.

In the first to fifth embodiments, the case where the oxide semiconductor layer 10 is a metal oxide containing indium (In), gallium (Ga), and zinc (Zn) has been described as an example. However, other metal oxides can be applied to the oxide semiconductor layer 10.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an oxide semiconductor layer;
   a gate electrode;
   a gate insulating layer provided between the oxide semiconductor layer and the gate electrode;
   a first electrode electrically connected to the oxide semiconductor layer at a first position of the oxide semiconductor layer;
   a second electrode electrically connected to the oxide semiconductor layer at a second position of the oxide semiconductor layer disposed in a first direction with respect to the first position;
   a first conductive layer provided at at least one position between the oxide semiconductor layer and the first electrode or between the oxide semiconductor layer and the second electrode, the first conductive layer containing a first metal element, a first element different from the first metal element, and oxygen (O); and
   a second conductive layer provided between the oxide semiconductor layer and the first conductive layer, the second conductive layer containing oxygen (O) and a second element different from both of the first metal element and the first element,
   wherein a third position of the oxide semiconductor layer facing the gate electrode is disposed between the first position and the second position in the first direction.

2. The semiconductor device according to claim 1, wherein the first metal element is at least one element selected from the group consisting of titanium (Ti), silver (Ag), nickel (Ni), copper (Cu), and tantalum (Ta).

3. The semiconductor device according to claim 1, wherein the first element is at least one element selected from the group consisting of zinc (Zn), silicon (Si), aluminum (Al), tin (Sn), gallium (Ga), hafnium (Hf), lanthanum (La), and cerium (Ce).

4. The semiconductor device according to claim 1, wherein the second element is at least one element selected from the group consisting of indium (In), zinc (Zn), tin (Sn), and cadmium (Cd).

5. The semiconductor device according to claim 1, wherein each of the first electrode and the second electrode is a metal having a chemical composition different from a chemical composition of the first conductive layer.

6. The semiconductor device according to claim 1, wherein each of the first electrode and the second electrode contains tungsten (W) or molybdenum (Mo).

7. The semiconductor device according to claim 1, wherein the oxide semiconductor layer contains indium (In), gallium (Ga), and zinc (Zn).

8. The semiconductor device according to claim 1, further comprising:
   a third conductive layer provided at at least one position between the first electrode and the first conductive layer or between the second electrode and the first conductive layer, the third conductive layer containing the first metal element, and a concentration of the first metal element in the third conductive layer being higher than a concentration of the first metal element in the first conductive layer.

9. The semiconductor device according to claim 1, wherein a thickness of the first conductive layer is more than a thickness of the second conductive layer.

10. The semiconductor device according to claim 1, wherein the first conductive layer is amorphous.

11. The semiconductor device according to claim 1, wherein the gate electrode surrounds the oxide semiconductor layer.

12. A semiconductor device comprising:
   an oxide semiconductor layer;
   a gate electrode;
   a gate insulating layer provided between the oxide semiconductor layer and the gate electrode;
   a first electrode electrically connected to the oxide semiconductor layer at a first position of the oxide semiconductor layer;
   a second electrode electrically connected to the oxide semiconductor layer at a second position of the oxide semiconductor layer disposed in a first direction with respect to the first position;
   a first conductive layer provided at at least one position between the oxide semiconductor layer and the first electrode or between the oxide semiconductor layer and the second electrode, the first conductive layer containing a first metal element, a first element different from the first metal element, and at least one element of oxygen (O) or nitrogen (N); and
   a second conductive layer provided between the oxide semiconductor layer and the first conductive layer, the second conductive layer containing oxygen (O) and a second element different from both of the first metal element and the first element,
   wherein a third position of the oxide semiconductor layer facing the gate electrode is disposed between the first position and the second position in the first direction,
   wherein a crystal grain size of the first conductive layer is smaller than a crystal grain size of the second conductive layer.

13. A semiconductor memory device comprising:
   a first wire extending in a first direction;
   a second wire extending in a second direction intersecting the first direction; and
   a memory cell,
   wherein the memory cell includes
   an oxide semiconductor layer electrically connected to the first wire, the oxide semiconductor layer being surrounded by a part of the second wire,
   a gate insulating layer provided between the oxide semiconductor layer and the part of the second wire,
   a capacitor electrically connected to the oxide semiconductor layer,
   a first conductive layer provided at at least one position between the oxide semiconductor layer and the first wire or between the oxide semiconductor layer and the capacitor, the first conductive layer containing a first metal element, a first element different from the first metal element, and oxygen (O), and
   a second conductive layer provided between the oxide semiconductor layer and the first conductive layer, the second conductive layer containing oxygen (O) and a second element different from both of the first metal element and the first element.

14. The semiconductor memory device according to claim 13, wherein the first metal element is at least one element selected from the group consisting of titanium (Ti), silver (Ag), nickel (Ni), copper (Cu), and tantalum (Ta).

15. The semiconductor memory device according to claim 13, wherein the first element is at least one element selected from the group consisting of zinc (Zn), silicon (Si), aluminum (Al), tin (Sn), gallium (Ga), hafnium (Hf), lanthanum (La), and cerium (Ce).

16. The semiconductor memory device according to claim 13, wherein the second element is at least one element selected from the group consisting of indium (In), zinc (Zn), tin (Sn), and cadmium (Cd).

* * * * *